United States Patent
Qu

(10) Patent No.: US 11,782,111 B2
(45) Date of Patent: Oct. 10, 2023

(54) METHOD FOR RECONSTRUCTING MAGNETIC RESONANCE SPECTRUM BASED ON DEEP LEARNING

(71) Applicant: Xiamen University, Fujian (CN)

(72) Inventor: Xiaobo Qu, Fujian (CN)

(73) Assignee: Xiamen University, Fujian (CN)

( * ) Notice: Subject to any disclaimer, the term of this patent is extended or adjusted under 35 U.S.C. 154(b) by 317 days.

(21) Appl. No.: 17/385,104

(22) Filed: Jul. 26, 2021

(65) Prior Publication Data
US 2021/0382127 A1 Dec. 9, 2021

Related U.S. Application Data

(63) Continuation of application No. PCT/CN2019/120101, filed on Nov. 22, 2019.

(30) Foreign Application Priority Data

Jan. 25, 2019 (CN) .......................... 201910075573.3

(51) Int. Cl.
*G01R 33/56* (2006.01)
*G06N 3/08* (2023.01)
*G06N 3/045* (2023.01)

(52) U.S. Cl.
CPC ......... *G01R 33/5608* (2013.01); *G06N 3/045* (2023.01); *G06N 3/08* (2013.01)

(58) Field of Classification Search
CPC ............ G01R 33/5608; G01R 33/4633; G01R 33/4625; G06N 3/045; G06N 3/08; G06T 5/50
See application file for complete search history.

(56) References Cited

U.S. PATENT DOCUMENTS

2003/0078739 A1  4/2003 Norton et al.
2020/0041597 A1* 2/2020 Daval Frerot ......... G01R 33/50

FOREIGN PATENT DOCUMENTS

CN          107749061 A    3/2018
CN          108535675 4    9/2018
                (Continued)

OTHER PUBLICATIONS

Machine translation of CN-108629784-A1 (Year: 2018).*
(Continued)

*Primary Examiner* — G.M. A Hyder
(74) *Attorney, Agent, or Firm* — COOPER LEGAL GROUP, LLC

(57) ABSTRACT

A new method for reconstructing a full spectrum from under-sampled magnetic resonance spectrum data by using a deep learning network. First, the exponential function is used to generate a time-domain signal of the magnetic resonance spectrum, and a zero-filling time-domain signal is obtained after the under-sampled operation is completed in the time domain. The zero-filling time-domain signal and the full spectrum corresponding to the full sampling are combined to form a training data set. Then, a data verification convolutional neural network model is established for magnetic resonance spectrum reconstruction, where the training data set is used to train neural network parameters to form a trained neural network. Finally, the under-sampled magnetic resonance time-domain signal is input to the trained data verification convolutional neural network, and the full magnetic resonance spectrum is reconstructed.

13 Claims, 2 Drawing Sheets

(56) References Cited

FOREIGN PATENT DOCUMENTS

| CN | 108629784 A | * 10/2018 | ........... G06N 3/0454 |
|---|---|---|---|
| CN | 108828481 A | 11/2018 | |
| CN | 108898568 A | 11/2018 | |
| CN | 109903259 A | 6/2019 | |
| WO | 2017113205 A1 | 7/2017 | |

OTHER PUBLICATIONS

Qu Xiaobo et al., "Accelerated NMR spectroscopy with low-Rank reconstruction[J]A", Angewandte Chemie International Edition, 2015, 54(3): pp. 852-854.

Ying, et al. "Hankel matrix nuclear norm regularized tensor completion for N-dimensional exponential signals", IEEE Transactions on Signal Processing, 2017, 65(14): pp. 3702-3717.

Ying et al. "Vanderrnonde factorization of Hanksl matrix for complex exponential signal recovery-application in fast NMR spectroscopy", IEEE Transactions on Signal Processing, 2018, 66(21): pp. 5520-5533.

Guo et al., "Improved reconstruction of low intensity magnetic resonance spectroscopy with weighted low rank Hankel matrix completion", IEEE Access, 2018, 6: pp. 4933-4940.

Qu, et al., "High-fidelity spectroscopy reconstruction in accelerated NMR[J]", Chemical Communications, 2018, 54(78): pp. 10958-1096.

Guo et al., "Fast low rank Hankel matrix factorization reconstruction method for non-uniformly sampled magnetic resonance spectroscopy", IEEE Access, 2017, 5: pp. 16033-16039.

Lu et al., "Low rank enhanced matrix recovery of hybrid time and frequency data in fast magnetic resonance spectroscopy" .IEEE Transactions on Biomedical Engineering, 2018, 65(4): pp. 809-820.

Lecun et al. "Gradient-based learning applied to document recognition", Proceedings of the IEEE, 1998, 86(11): pp. 2278-2324.

Jo, et al. "Deep cascade of convolutional neural networks for dynamic MR image reconstruction", IEEE Transactions on Medical Imaging, 2018, 37(2): 491-503).

International Search Report and English Translation cited in PCT/CN2019/120101 dated Feb. 21, 2020, 6 pages.

Written Opinion cited in PCT/CN2019/120101 dated Feb. 21, 2020, 11 pages.

* cited by examiner

METHOD FOR RECONSTRUCTING MAGNETIC RESONANCE SPECTRUM BASED ON DEEP LEARNING

RELATED APPLICATIONS

This application is a continuation of International patent application PCT/CN2019/120101, filed on Nov. 22, 2019, which claims priority to Chinese patent application 201910075573.3, filed on Jan. 25, 2019. International patent application PCT/CN2019/120101 and Chinese patent application 201910075573.3 are incorporated herein by reference.

FIELD OF THE DISCLOSURE

The present disclosure relates to a method for reconstructing magnetic resonance spectrum, and in particular relates to a method for reconstructing magnetic resonance spectrum based on deep learning.

BACKGROUND OF THE DISCLOSURE

Magnetic Resonance Spectroscopy (MRS) is a technique for determining molecular structure and has important applications in the fields of medicine, chemistry, and biology. The high-quality spectrum signal should be guaranteed while reducing the sampling time is the key to magnetic resonance spectroscopy.

The traditional magnetic resonance spectrum reconstruction method mainly uses the mathematical characteristics of the magnetic resonance signal in time or frequency domain. Qu Xiaobo et al. (Qu X., Mayzel M., Cai J., Chen Z., Orekhov V., "Accelerated NMR spectroscopy with low-Rank reconstruction[J]", Angewandte Chemie International Edition, 2015, 54(3): 852-854) proposed a magnetic resonance spectrum reconstruction method based on a low-rank Hankel matrix. The high-quality spectrum signal reconstructed in the under-sampled process solves the problem of poor reconstruction effect for spectral peaks of different widths. This method has also been extended to three-dimensional and higher-dimensional spectral reconstruction (Ying J., Lu H., Wei Q., Cai J., Guo D., Wu J., Chen Z., Qu X., "Hankel matrix nuclear norm regularized tensor completion for N-dimensional exponential signals[J]", IEEE Transactions on Signal Processing, 2017, 65(14): 3702-3717), and through the Vandermonde decomposition of the Hankel matrix (Ying J., Cai J., Guo Di, Tang G., Chen Z., Qu X., "Vandermonde factorization of Hankel matrix for complex exponential signal recovery-application in fast NMR spectroscopy[J]", IEEE Transactions on Signal Processing, 2018, 66(21): 5520-5533) and singular value operations (Guo D, Qu X., "Improved reconstruction of low intensity magnetic resonance spectroscopy with weighted low rank Hankel matrix completion[J]", IEEE Access, 2018, 6: 4933-4940) and (Qu X., Qiu T., Guo Di, Lu H., Ying J., Shen M., Hu B., Orekhov V., Chen Z. "High-fidelity spectroscopy reconstruction in accelerated NMR[J]", Chemical Communications, 2018, 54(78): 10958-10961), it improved reconstruction ability of spectral reconstruction for dense peaks and low intensities spectral peaks. However, this type of low-rank Hankel matrix reconstruction method consumes a lot of time for the singular value decomposition in the iterative calculation, which results in a longer spectrum reconstruction time. Guo Di et al. (Guo D., Lu H., Qu X A, "Fast low rank Hankel matrix factorization reconstruction method for non-uniformly sampled magnetic resonance spectroscopy [J]", IEEE Access, 2017, 5: 16033-16039) successfully factorized low-rank matrices and introduce parallel calculations to avoid the time-complex singular value decomposition method. Lu Hengfa et al. (Lu H, Zhang X, Qiu T, Yang J, Ying J, Guo D, Chen Z, Qu X. Low rank enhanced matrix recovery of hybrid time and frequency data in fast magnetic resonance spectroscopy[J].IEEE Transactions on Biomedical Engineering, 2018, 65(4): 809-820) proposed to use Frobenius Norm to perform matrix factorization to avoid singular value decomposition, and completed the rapid and high-quality spectral reconstruction of under-sampled multi-dimensional magnetic resonance spectrum signals.

Deep learning is an emerging method for data processing and reconstruction. Lecun et al. (Lecun Y., Bottou L., Bengio Y., Haffner P., "Gradient-based learning applied to document recognition[J]", Proceedings of the IEEE, 1998, 86(11): 2278-2324) proposed convolutional neural networks (CNN) and has received a lot of attention and developed rapidly. Jo Schlemper et al. (Schlemper J., Caballero J., Hajnal J V, Price A., Rueckert D A "Deep cascade of convolutional neural networks for dynamic MR image reconstruction[J]", IEEE Transactions on Medical Imaging, 2018, 37(2): 491-503) proposed a neural network structure for compressed sensing reconstruction using the measured data collected by the equipment as the training set.

BRIEF SUMMARY OF THE DISCLOSURE

The present disclosure provides a method for reconstructing magnetic resonance spectrum based on deep learning.

The present disclosure comprises the following steps. A method for reconstructing magnetic resonance spectrum based on deep learning, comprises:

1) Generating a time-domain signal of the magnetic resonance spectrum using an exponential function.

In step 1), the data $T^{n,m}$, in the n-th row and m-th column of the full sampling magnetic resonance signal $T \in \mathbb{C}^{N \times M}$ in time domain can be generated according to the exponential function as follows:

$$T^{n,m} = \sum_{r=1}^{R} a_r e^{\left(i2\pi n \Delta t_1 f_{1,r} - \frac{n \Delta t_1}{\tau_{1,r}}\right)} e^{\left(i2\pi m \Delta t_2 f_{2,r} - \frac{m \Delta t_2}{\tau_{2,r}}\right)}. \quad (1)$$

Wherein $\mathbb{C}$ represents a set of complex numbers, N and M represent a number of rows and columns of a time signal, R represents a number of spectral peaks, $a_r$ represents a size of an amplitude, $\Delta t_1$ and $\Delta t_2$ represent time increases, $f_{1,r}$ and $f_{2,r}$ represent normalized frequencies, and $\tau_{1,r}$ and $\tau_{2,r}$ represent decay factors. The expression (1) is also used to a full sampling signal of a one-dimensional free induction decay, when n=1, m>1, or m=1, n>1.

2) Constructing a training set comprising an under-sampled time-domain signal of the magnetic resonance spectrum and a corresponding full-sampling spectrum.

In step 2), the constructing the training set of the under-sampled time-domain signal of the magnetic resonance spectrum and the full-sampling spectrum comprises: representing an under-sampled operation in a time domain by U, sampling a data point represented by white color, not sampling a data point represented by black color, wherein Ω represents an index subset of an under-sampled template M. When an index (p, q) of a certain signal point appears in the index subset Ω, (p, q)∈Ω. When the index (p, q) of the certain signal point does not appear in the index subset Ω, (p,q)∉Ω. Filling zeros to signal in all non-sampled positions to obtain a zero-filling time-domain signal $T_u$ according to the under-sampled template M, using Fourier transform to obtain a spectrum signal $S_u$ with aliasing from the zero-filling time-domain signal $T_u$, using Fourier transform to obtain a full-sampling spectrum S from the full-sampling signal T, and separately saving a real part and an imaginary part of the full-sampling spectrum S, that is, $S \in \mathbb{R}^{2 \times 256 \times 116}$, wherein $\mathbb{R}$ represents a real number and the training set $\mathcal{D}$ comprises zero-filling time-domain signal $T_u$ and the full-sampling spectrum S.

3) Designing a convolutional neural network of a data verification convolutional neural network structure.

In step 3), a module of the convolutional neural network comprises L convolutional layers, each convolutional layer of the L convolutional layers comprises I filters, the convolutional layers are densely connected, an input of each convolutional layer is an union of outputs of all previous convolutional layers in the module, in all convolutional layers, sizes of the convolution kernels are k, an input signal $S_l$ of an $l^{th}$ layer ($1 \leq l \leq L$) passes through the convolutional neural network to obtain an output signal $S_{cnn,l}$ due to the module of the convolutional neural network, where $$S_{cnn,l} = f(S_l | \theta) \qquad (2),$$

wherein $\theta$ represents a training parameter of the convolutional neural network and $f(S_l|\theta)$ represents a non-linear mapping from $S_l$ to $S_{cnn,l}$ of the training.

4) Designing a bottleneck layer of the data verification convolutional neural network structure.

In step 4), the designing the bottleneck layer of the data verification convolutional neural network structure comprises: mainly using the bottleneck layer to change a number of feature maps in the data verification convolutional neural network structure; and disposing the bottleneck layer before and after the module of the convolutional neural network, wherein: the signal passes through the bottleneck layer of $K_i$ filters to increase the number of feature maps before entering the module of the convolutional neural network, and an output signal of the module of the convolutional neural network also passes through the bottleneck layer of $k_o$ filters to reduce the number of feature maps.

5) Designing a data verification layer of the data verification convolutional neural network structure.

In step 5), the designing the data verification layer of the data verification convolutional neural network structure comprises: verifying the data by the data verification layer in the data verification convolutional neural network structure, inputting an output signal $S_{cnn,l}$ from an i-th convolutional neural network, converting the output signal $S_{cnn,l}$ (which becomes an input signal) back to the time domain using inverse Fourier transform $F^H$ to obtain signal $T_l$, wherein a formula is as follows:

$$T_l = F^H S_{cnn,l} \qquad (3).$$

An expression of the data verification layer is as follows:

$$\hat{T}_l^{n,m} = \begin{cases} T_l^{n,m}, & \text{if } (n,m) \notin \Omega \\ \dfrac{T_l^{n,m} + \lambda T_u^{n,m}}{1 + \lambda}, & \text{if } (n,m) \in \Omega \end{cases} \qquad (4)$$

Finally outputting reconstructed spectrum $\hat{S}_l = F\hat{T}_l$, wherein: at last time, a spectrum $\hat{S}_L$ of an L-th layer (L>1) defines an output $\hat{S}$ of an entire deep learning network.

6) Designing data to verify a feedback function of the data verification convolutional neural network structure.

In step 6), the feedback function enables an output of each module of a combination of the convolutional neural network and the data verification layer to be close to a full-sampling spectrum signal (e.g., a real spectrum signal) S=FT in the data verification convolutional neural network structure and enables an input of a next module to be more interpretable, and the designing data to verify the feedback function of the data verification convolutional neural network structure comprises: comparing an output of each data verification layer with the full-sampling spectrum signal S=FT to feed back to each module to update parameters, wherein T represents a full-sampling time-domain signal in formula (1), and F represents Fourier transform.

7) Establishing the data verification convolutional neural network structure to function as a spectrum reconstruction model.

In step 7), the data verification convolutional neural network structure cascades with multiple modules of combinations of the convolutional neural network and the data verification layer, establishing the data verification convolutional neural network structure to function as the spectrum reconstruction model comprises: inputting the under-sampled magnetic resonance time-domain signal $T_u$, and outputting a reconstructed magnetic resonance spectrum signal $\hat{S}$, thereby constituting an end-to-end deep neural network structure, a loss function of the data verification the convolutional neural network structure is as follows:

$$\mathcal{L}(\theta) = \sum_{(T_u, S) \in \mathcal{D}} \|S - \hat{S}\|_F^2 \qquad (5).$$

Wherein $\mathcal{D}$ represents the training set, $\|\bullet\|_F$ represents F-norm (Frobenius norm) of a matrix, $\hat{S} = f(T_u|\theta, \lambda)$, $\theta$ represents a training parameter of the convolutional neural network, $\lambda$ represents a data verification parameter of the data verification layer, and both parameters $\theta$ and $\lambda$ need to be trained.

8) Training and optimizing parameters of the convolutional neural network.

In step 8), the training parameters of the convolutional neural network comprises: training parameters of the spectrum reconstruction model in step 7) using Adam algorithm to obtain optimal value $\hat{\theta}$ and $\hat{\lambda}0$ of the spectrum reconstruction model.

9) Reconstructing from under-sampled time-domain signal $\tilde{T}_u$ of a target magnetic resonance spectrum.

In step 9), the reconstructing from under-sampled time-domain signal $\tilde{T}_u$ of the target magnetic resonance comprises: inputting the under-sampled time-domain signal $\tilde{T}_u$ to the spectrum reconstruction model, and reconstructing the reconstructed magnetic resonance spectrum signals $\tilde{S}$ after a forward propagation of the spectrum reconstruction model, where:

$$\tilde{S} = f(\tilde{T}_u | \hat{\theta}, \hat{\lambda}) \qquad (6).$$

10) Using a strong fitting ability of the data verification convolutional neural network and a data verification ability of the data verification layer to complete a rapid and high-quality reconstruction from the under-sampled time-domain signal $\tilde{T}_u$ of the target magnetic resonance spectrum while performing an under-sampled operation in a time domain.

The present disclosure provides a new method for reconstructing a full spectrum from under-sampled magnetic resonance spectrum data by using a deep learning network. First, a limited exponential function is used to generate a time-domain signal of the magnetic resonance spectrum, and a spectrum signal $S_u$ with aliasing is obtained after the under-sampled operation occurs in the time domain. The spectrum with aliasing and the corresponding full sampling spectrum are combined to form a training data set. Then, a data verification convolutional neural network model is established for magnetic resonance spectrum reconstruction, where the training data set is used to train neural network parameters to form a trained neural network. Finally, the under-sampled magnetic resonance time-domain signal is input to the trained data verification convolutional neural network, and the full magnetic resonance spectrum is reconstructed.

Compared with the existing techniques, the present disclosure has the following advantages.

The present disclosure has a faster reconstruction speed and does not require a real measured data set collected by a device to function as a training set, a time signal generated by the exponential functions as the training set of the magnetic resonance spectrum, and the corresponding neural network structure is designed. This method for reconstructing the magnetic resonance spectrum through the data verification convolutional neural network has characteristics of fast reconstruction speed and high quality reconstructed spectrum.

BRIEF DESCRIPTION OF THE DRAWINGS

FIG. 3a illustrates the full-sampling spectrum, and FIG. 3b illustrates the reconstructed spectrum of Embodiment 1 of the present disclosure.

DETAILED DESCRIPTION OF THE EMBODIMENTS

The present disclosure will be further described in combination with the accompanying embodiments and drawings.

In an embodiment of the present disclosure, an exponential function is used to generate a training network for a magnetic resonance signal, and then a two-dimensional magnetic resonance spectrum is reconstructed from an under-sampled magnetic resonance time domain signal. The detailed process is as follows.

1) The Exponential Function is Used to Generate a Time Domain Signal of a Magnetic Resonance Spectrum In this embodiment, 5200 free induction decay signals are generated. The data $T^{n,m}$, in the n-th row and m-th column of the full sampling magnetic resonance signal $T \in \mathbb{C}^{N \times M}$ in time domain, can be generated according to the exponential function as follows:

$$T^{n,m} = \sum_{r=1}^{R} a_r e^{\left(i2\pi n\Delta t_1 f_{1,r} - \frac{n\Delta t_1}{\tau_{1,r}}\right)} e^{\left(i2\pi m\Delta t_2 f_{2,r} - \frac{m\Delta t_2}{\tau_{2,r}}\right)}. \quad (1)$$

Wherein $\mathbb{C}$ represents a set of complex numbers, N and M represent a number of rows and columns of a time signal, R represents a number of spectral peaks, $a_r$ represents a size of an amplitude, $\Delta t_1$ and $\Delta t_2$ represent time increases, $f_{1,r}$ and $f_{2,r}$ epresent normalized frequencies, and $\tau_{1,r}$ and $\tau_{2,r}$ represent decay factors. In this embodiment, N=256 and M=116, and the number of the spectral peaks R is 2 to 52. With respect to fixed spectral peaks, 200 free induction decay signals with various amplitudes, frequencies, and decay factors will be generated. A range of the amplitude $a_r$ is $0.05 \leq a_r \leq 1$, ranges of the normalized frequencies $f_{1,r}$ and $f_{2,r}$ are $0.05 \leq f_{1,r}$ and $f_{2,r} \leq 1$, and ranges of the decay factors $\tau_{1,r}$ and $\tau_{2,r}$ are $19.2 \leq \tau_{1,r}$ and $\tau_{2,r} \leq 179.2$.

Figure 2:
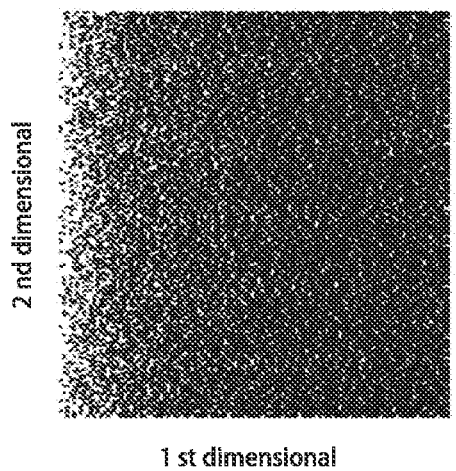
FIG. 2 illustrates an under-sampled template.

2) A Training Set Including the Under-Sampled Time-Domain Signal and a Corresponding Full-Sampling Spectrum is Established U represents an under-sampled operation in the time domain. FIG. 2 illustrates a schematic diagram of an under-sampled template M. In the under-sampled template M, a data point represented by white color is sampled, and a data point represented by black color is not sampled. 30% of data points are sampled in total. $\Omega$ represents an index subset of the under-sampled template M. When an index (p, q) of a certain signal point appears in the index subset $\Omega$, $(p,q) \in \Omega$. When the index (p, q) of the certain signal point does not appear in the index subset $\Omega$, $(p,q) \notin \Omega$. Filling zeros to signal in all non-sampled positions to obtain a zero-filling time-domain signal $T_u$ according to the under-sampled template M, and a spectrum signal $S_u$ with aliasing is obtained from the zero-filling time-domain signal $T_u$ using Fourier transform. A full-sampling spectrum S is obtained from the full-sampling signal T using Fourier transform, and a real part and an imaginary part of the full-sampling spectrum S are separately saved, that is, $S \in \mathbb{R}^{2 \times 256 \times 116}$, wherein $\mathbb{R}$ represents a real number. The training set $\mathcal{D}$ comprises the zero-filling time-domain signal $T_u$ and the full-sampling spectrum S.

3) A Convolutional Neural Network of a Data Verification Convolutional Neural Network Structure is Designed A module of the convolutional neural network comprises 8 convolutional layers, and each convolutional layer comprises 12 filters. The convolutional layers are densely connected, and an input of each convolutional layer is a union of outputs of all previous convolutional layers in the module. In all convolutional layers, the size of convolution kernels in each of the convolution layers is 3×3. An input signal $S_l$ of an $l^{th}$ layer ($1 \leq l \leq L$) passes through the convolutional neural network to obtain an output signal $S_{cnn,l}$ due to the module of the convolutional neural network. A definition of the output signal $S_{cnn,l}$ is as follows:

$$S_{cnn,l} = f(S_l | \theta) \quad (2),$$

wherein $\theta$ represents a training parameter of the convolutional neural network, and $f(S_l | \theta)$ represents a non-linear mapping from $S_l$ to $S_{cnn,l}$ of the training.

4) A Bottleneck Layer of the Data Verification Convolutional Neural Network Structure is Designed The bottleneck layer is mainly used to change a number of feature maps in the data verification convolutional neural network structure. The bottleneck layer is disposed before and after the module of the convolutional neural network. The signal will pass through the bottleneck layer of 16 filters to increase the number of feature maps before entering into the module of the convolutional neural network, and an output signal of the module of the convolutional neural network will also pass through the bottleneck layer of 2 filters to reduce the number of feature maps.

5) A Data Verification Layer of the Data Verification Convolutional Neural Network Structure is Designed The data verification layer is mainly used to verify data in the data verification convolutional neural network structure. The output signal $S_{cnn,l}$ from the $l^{th}$ convolutional neural network functions as an input, and the output signal $S_{cnn,l}$ (which becomes an input signal) is converted back to the time domain using inverse Fourier transform $F^H$ to obtain a signal $T_l$. The formula is as follows:

$$T_l = F^H S_{cnn,l} \qquad (3).$$

An expression of the data verification layer is as follows:

$$\hat{T}_l^{n,m} = \begin{cases} T_l^{n,m}, & \text{if } (n,m) \notin \Omega \\ \dfrac{T_l^{n,m} + \lambda T_u^{n,m}}{1+\lambda}, & \text{if } (n,m) \in \Omega \end{cases} \qquad (4)$$

A reconstructed spectrum signal $\hat{S}_l = F\hat{T}_l$ is finally output, wherein the last time, that is, a spectrum $\hat{S}_8$ of an $8^{th}$ layer, defines an output $\hat{S}$ of an entire deep learning network.

6) A Feedback Function of the Data Verification Convolutional Neural Network Structure is Designed The feedback function enables an output of each module of a combination of the convolutional neural network and the data verification layer to be close to a full-sampling spectrum signal $S=FT$ in the convolutional neural network structure and enables an input of a next module to be more interpretable. An output of each data verification layer is compared with the full-sampling spectrum signal $S=FT$ to feed back to each module to update parameters, wherein T represents a full-sampling time-domain signal in formula (1), and F represents Fourier transform.

Figure 1:
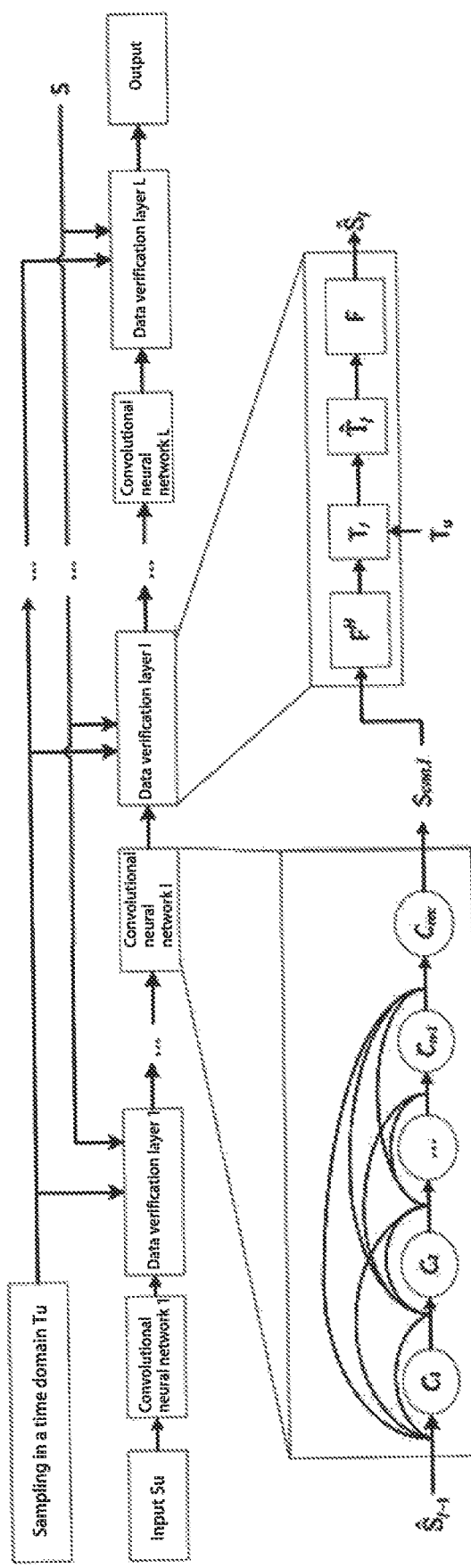
FIG. 1 illustrates a data verification convolutional neural network structure for magnetic resonance spectrum reconstruction.

7) The Data Verification Convolutional Neural Network Structure is Established to Function as the Spectrum Reconstruction Model The data is used to verify the convolutional neural network structure that is cascaded with multiple modules of the combinations of the convolutional neural networks and the data verification layers. The under-sampled magnetic resonance time-domain signal $T_u$ is inputted, and a reconstructed magnetic resonance spectrum signal $\hat{S}$ is outputted, thereby constituting an end-to-end deep neural network structure. A loss function of the data verification convolutional neural network structure is defined as follows:

$$\mathcal{L}(\theta) = \Sigma_{(T_u,S) \subset \mathcal{D}} \|S - \hat{S}\|_F^2 \qquad (5),$$

wherein $\mathcal{D}$ represents the training set, $\|\bullet\|_F$ represents F-norm (Frobenius norm) of a matrix, $\hat{S} = f(T_u|\theta, \lambda)$, $\theta$ represents a training parameter of the convolutional neural network, $\lambda$ represents a data verification parameter of the data verification layer, and both parameters $\theta$ and $\lambda$ need to be trained. FIG. 1 illustrates a final design of the data verification convolutional neural network structure.

8) Parameters of the Convolutional Neural Network are Trained and Optimized

Adam algorithm that is conventional in deep learning is used to train the parameters of the spectrum reconstruction model in step 7) to obtain optimal value $\hat{\theta}$ and $\hat{\lambda}$ of the spectrum reconstruction model.

9) The Under-Sampled Time-Domain Signal $\tilde{T}_u$ of a Target Magnetic Resonance Spectrum $\tilde{S}$ is Reconstructed The under-sampled magnetic resonance time-domain signal $\tilde{T}_u$ is input to a spectrum reconstruction model. After a forward propagation of the spectrum reconstruction model, the constructed magnetic resonance spectrum $\tilde{S}$ is reconstructed. The formula is as follows:

$$\tilde{S} = f(\tilde{T}_u | \hat{\theta}, \hat{\lambda}) \qquad (6).$$

Figure 3A:
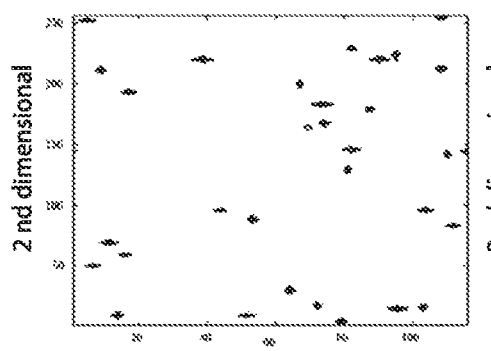
FIGS. 3a and 3b illustrate a full-sampling spectrum and a reconstructed spectrum obtained after reconstruction of under-sampled magnetic resonance time-domain data of Embodiment 1.
Figure 3B:
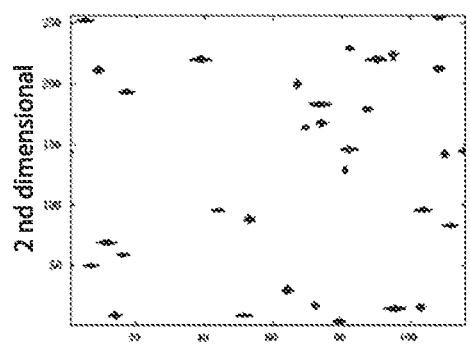
Figure 4:
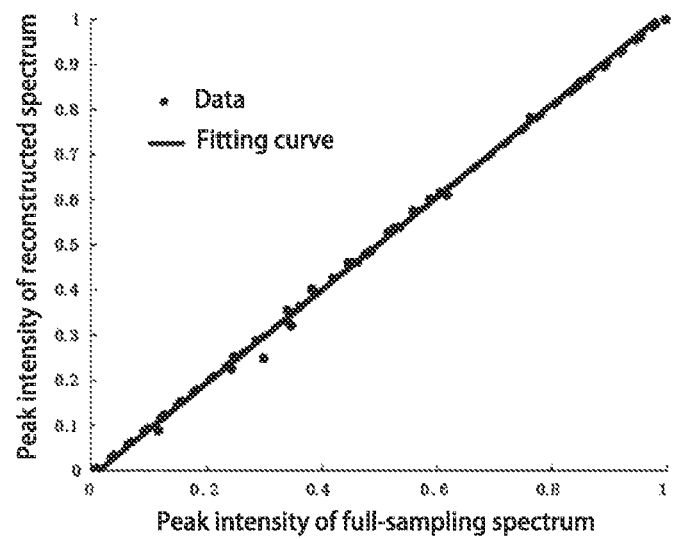
FIG. 4 illustrates a correlation between a peak intensity of the full-sampling spectrum and a peak intensity of the reconstructed spectrum.

FIG. 3b illustrates the spectrum obtained using reconstruction from the under-sampled magnetic resonance time-domain data in the embodiment. Compared with the full-sampling spectrum illustrated in FIG. 3a, it can be seen that a designed data verification convolutional neural network and a network trained by a synthetic simulation magnetic resonance spectrum are used to obtain a high-quality magnetic resonance spectrum. FIG. 4 illustrates a correlation between a peak intensity of the full-sampling spectrum and a peak intensity of the reconstructed spectrum.

What is claimed is:

1. A method for reconstructing magnetic resonance spectrum based on deep learning, comprising:
   1) generating a time-domain signal of the magnetic resonance spectrum using an exponential function;
   2) constructing a training set comprising an under-sampled time-domain signal of the magnetic resonance spectrum and a corresponding full-sampling spectrum;
   3) designing a convolutional neural network of a data verification convolutional neural network structure;
   4) designing a bottleneck layer of the data verification convolutional neural network structure;
   5) designing a data verification layer of the data verification convolutional neural network structure;
   6) designing data to verify a feedback function of the data verification convolutional neural network structure;
   7) establishing the data verification convolutional neural network structure to function as a spectrum reconstruction model;
   8) training parameters of the convolutional neural network;
   9) reconstructing an under-sampled time-domain signal $\tilde{T}_u$ of a target magnetic resonance spectrum; and
   10) using a fitting ability of the data verification convolutional neural network and a data verification ability of the data verification layer to complete a reconstruction from the under-sampled time-domain signal $\tilde{T}_u$ of the target magnetic resonance spectrum while performing an under-sampled operation in a time domain.

2. The method for reconstructing the magnetic resonance spectrum based on the deep learning according to claim 1, wherein in step 1):
   a data $T^{n,m}$, in an n-th row and an-th column of a full-sampling magnetic resonance signal $T \in \mathbb{C}^{N \times M}$ in time domain is generated according to an exponential function as follows:

$$T^{n,m} = \sum_{r=1}^{R} a_r e^{\left(i2\pi n \Delta t_1 f_{1,r} - \frac{n \Delta t_1}{\tau_{1,r}}\right)} e^{\left(i2\pi m \Delta t_2 f_{2,r} - \frac{m \Delta t_2}{\tau_{2,r}}\right)}, \qquad (1)$$

wherein $\mathbb{C}$ represents a set of complex numbers, N and M represent a number of rows and columns of a time signal, R represents a number of spectral peaks, $a_r$ represents a size of an amplitude, $\Delta t_1$ and $\Delta t_2$ represent time increases, $f_{1,r}$ and $f_{2,r}$ represent normalized frequencies, and $\tau_{1,r}$ and $\tau_{2,r}$ represent decay factors; and the expression (1) is also used to a full sampling signal of a one-dimensional free induction decay, when n=1, m>1, or m=1, n>1.

3. The method for reconstructing the magnetic resonance spectrum based on the deep learning according to claim 2, wherein in step 2), the constructing the training set of the under-sampled time-domain signal of the magnetic resonance spectrum and the full-sampling spectrum comprises:

representing an under-sampled operation in a time domain by U, sampling a data point represented by white color, not sampling a data point represented by black color, wherein:

Ω represents an index subset of an under-sampled template M, when an index (p, q) of a certain signal point appears in the index subset Ω, (p,q)∈Ω, and when the index (p, q) of the certain signal point does not appear in the index subset Ω, (p,q)∉Ω, filling zeros to signal in all non-sampled positions to obtain a zero-filling time-domain signal $T_u$ according to the under-sampled template M, using Fourier transform to obtain a spectrum signal $S_u$ with aliasing from the zero-filling time-domain signal $T_u$, using Fourier transform to obtain a full-sampling spectrum S from the full-sampling signal T, and separately saving a real part and an imaginary part of the full-sampling spectrum S, that is, $S \in \mathbb{R}^{2 \times 256 \times 116}$, wherein $\mathbb{R}$ represents a real number and both $T_u$ and S are combined to define the training set $\mathcal{D}$.

4. The method for reconstructing the magnetic resonance spectrum based on the deep learning according to claim 2, wherein in step 6):

the feedback function enables an output of each module of a combination of the convolutional neural network and the data verification layer to be close to a full-sampling spectrum signal S=FT in the data verification convolutional neural network structure and enables an input of a next module to be more interpretable, and the designing data to verify the feedback function of the data verification convolutional neural network structure comprises:

comparing an output of each data verification layer with the full-sampling spectrum signal S=FT to feed back to each module to update parameters, wherein:

T represents a full-sampling time-domain signal in formula (1), and F represents Fourier transform.

5. The method for reconstructing the magnetic resonance spectrum based on the deep learning according to claim 4, wherein in step 7):

the data verification convolutional neural network structure cascades with multiple modules of combinations of the convolutional neural network and the data verification layer, establishing the data verification convolutional neural network structure to function as the spectrum reconstruction model comprises:

inputting the under-sampled magnetic resonance time-domain signal $T_u$, and outputting a reconstructed magnetic resonance spectrum signal $\hat{S}$, thereby constituting an end-to-end deep neural network structure, a loss function of the data verification the convolutional neural network structure is as follows:

$$\mathcal{L}(\theta) = \Sigma_{(T_u, S) \subset \mathcal{D}} \|S - \hat{S}\|_F^2 \quad (5),$$

wherein $\mathcal{D}$ represents the training set, $\|\cdot\|_F$ represents F-norm (Frobenius norm) of a matrix, $\hat{S}=f(T_u|\theta, \lambda)$, θ represents a training parameter of the convolutional neural network, λ represents a data verification parameter of the data verification layer, and both parameters θ and λ need to be trained.

6. The method for reconstructing the magnetic resonance spectrum based on the deep learning according to claim 5, wherein in step 8), the training parameters of the convolutional neural network comprises:

training parameters of the spectrum reconstruction model in step 7) using Adam algorithm to obtain value $\hat{\theta}$ and $\hat{\lambda}$ of the spectrum reconstruction model.

7. The method for reconstructing the magnetic resonance spectrum based on the deep learning according to claim 6, wherein in step 9), the reconstructing from under-sampled time-domain signal $\tilde{T}_u$ of the target magnetic resonance spectrum comprises:

inputting the under-sampled time-domain signal $\tilde{T}_u$ to the spectrum reconstruction model, and reconstructing the reconstructed magnetic resonance spectrum signal $\tilde{S}$ after a forward propagation of the spectrum reconstruction model, where:

$$\tilde{S} = f(\tilde{T}_u | \hat{\theta}, \hat{\lambda}) \quad (6).$$

8. The method for reconstructing the magnetic resonance spectrum based on the deep learning according to claim 1, wherein in step 3):

a module of the convolutional neural network comprises L convolutional layers, each convolutional layer of the L convolutional layers comprises I filters, the convolutional layers are densely connected, an input of each convolutional layer is an union of outputs of all previous convolutional layers in the module, in all convolutional layers, sizes of the convolution kernels are k, an input signal $S_l$ of an $l^{th}$ layer ($1 \leq l \leq L$) passes through the convolutional neural network to obtain an output signal $S_{cnn,l}$ due to the module of the convolutional neural network, where $$S_{cnn,l} = f(S_l | \theta) \quad (2),$$

wherein θ represents a training parameter of the convolutional neural network and $f(S_l|\theta)$ represents a non-linear mapping from $S_l$ to $S_{cnn,l}$ of the training.

9. The method for reconstructing the magnetic resonance spectrum based on the deep learning according to claim 8, wherein in step 4), the designing the bottleneck layer of the data verification convolutional neural network structure comprises:

changing a number of feature maps in the data verification convolutional neural network structure using the bottleneck layer; and disposing the bottleneck layer before and after the module of the convolutional neural network, wherein:

the signal passes through the bottleneck layer of $K_i$ filters to increase the number of feature maps before entering the module of the convolutional neural network, and an output signal of the module of the convolutional neural network also passes through the bottleneck layer of $k_o$ filters to reduce the number of feature maps.

10. The method for reconstructing the magnetic resonance spectrum based on the deep learning according to claim 9, wherein in step 5), the designing the data verification layer of the data verification convolutional neural network structure comprises:

verifying the data by the data verification layer in the data verification convolutional neural network structure, inputting an output signal $S_{cnn,l}$ from an i-th convolutional neural network, converting the output signal $S_{cnn,l}$ back to the time domain using inverse Fourier transform $F^H$ to obtain signal $T_l$, wherein a formula is as follows:

$$T_l = F^H S_{cnn,l} \quad (3),$$

an expression of the data verification layer is as follows:

$$\hat{T}_l^{n,m} = \begin{cases} T_l^{n,m}, & \text{if } (n,m) \notin \Omega \\ \frac{T_l^{n,m} + \lambda T_u^{n,m}}{1+\lambda}, & \text{if } (n,m) \in \Omega \end{cases} \quad (4)$$

finally outputting reconstructed spectrum $\hat{S}_l = F\hat{T}_l$, wherein:

at last time, a spectrum $\hat{S}L$ of an L-th layer (L>1) defines an output $\hat{S}$ of an entire deep learning network.

11. The method for reconstructing the magnetic resonance spectrum based on the deep learning according to claim 10, wherein in step 7):

the data verification convolutional neural network structure cascades with multiple modules of combinations of the convolutional neural network and the data verification layer, establishing the data verification convolutional neural network structure to function as the spectrum reconstruction model comprises:

inputting the under-sampled magnetic resonance time-domain signal $T_u$, and outputting a reconstructed magnetic resonance spectrum signal $\hat{S}$, thereby constituting an end-to-end deep neural network structure, a loss function of the data verification the convolutional neural network structure is as follows:

$$\mathcal{L}(\theta) = \Sigma_{(T_u,S) \in \mathcal{D}} \|S - \hat{S}\|_F^2 \quad (5),$$

wherein $\mathcal{D}$ represents the training set, $\|\cdot\|_F$ represents F-norm (Frobenius norm) of a matrix, $S = f(T_u|\theta, \lambda)$, $\theta$ represents a training parameter of the convolutional neural network, $\lambda$ represents a data verification parameter of the data verification layer, and both parameters $\theta$ and $\lambda$ need to be trained.

12. The method for reconstructing the magnetic resonance spectrum based on the deep learning according to claim 11, wherein in step 8), the training parameters of the convolutional neural network comprises:

training parameters of the spectrum reconstruction model in step 7) using Adam algorithm to obtain value $\hat{\theta}$ and $\hat{\lambda}$ of the spectrum reconstruction model.

13. The method for reconstructing the magnetic resonance spectrum based on the deep learning according to claim 12, wherein in step 9), the reconstructing from under-sampled time-domain signal $\tilde{T}_u$ of the target magnetic resonance spectrum comprises:

inputting the under-sampled time-domain signal $\tilde{T}_u$ to the spectrum reconstruction model, and reconstructing the reconstructed magnetic resonance spectrum signal $\tilde{S}$ after a forward propagation of the spectrum reconstruction model, where:

$$\tilde{S} = f(\tilde{T}_u | \hat{\theta}, \hat{\lambda}) \quad (6).$$

* * * * *